United States Patent
Nam

(10) Patent No.: US 7,563,702 B2
(45) Date of Patent: Jul. 21, 2009

(54) METHOD FOR FABRICATING SEMICONDUCTOR DEVICE

(75) Inventor: Ki-Won Nam, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 389 days.

(21) Appl. No.: 11/647,745

(22) Filed: Dec. 28, 2006

(65) Prior Publication Data

US 2007/0254466 A1 Nov. 1, 2007

(30) Foreign Application Priority Data

Apr. 28, 2006 (KR) .................. 10-2006-0038785
Dec. 4, 2006 (KR) .................. 10-2006-0121745

(51) Int. Cl.
*H01L 21/00* (2006.01)
(52) U.S. Cl. .................. 438/597; 438/694; 438/684
(58) Field of Classification Search .................. 438/597, 438/694, 684
See application file for complete search history.

(56) References Cited

U.S. PATENT DOCUMENTS

| 6,989,058 | B2 |   | 1/2006  | Bedell et al. |         |
|-----------|----|---|---------|---------------|---------|
| 7,279,419 | B2 | * | 10/2007 | Kim et al.    | 438/668 |
| 2005/0085072 | A1 | * | 4/2005  | Kim et al.    | 438/684 |
| 2006/0073699 | A1 | * | 4/2006  | Lee et al.    | 438/639 |
| 2006/0154460 | A1 | * | 7/2006  | Yun et al.    | 438/586 |
| 2006/0189080 | A1 | * | 8/2006  | Lee et al.    | 438/261 |
| 2006/0264032 | A1 | * | 11/2006 | Kim et al.    | 438/634 |
| 2006/0264047 | A1 | * | 11/2006 | Kim et al.    | 438/684 |
| 2007/0254466 | A1 | * | 11/2007 | Nam           | 438/597 |
| 2008/0160759 | A1 | * | 7/2008  | Lee et al.    | 438/672 |
| 2008/0293207 | A1 | * | 11/2008 | Koutny et al. | 438/306 |
| 2008/0296661 | A1 | * | 12/2008 | Ramkumar et al. | 257/324 |
| 2008/0296664 | A1 | * | 12/2008 | Ramkumar et al. | 257/326 |

FOREIGN PATENT DOCUMENTS

| KR | 10-2004-0059918 | 7/2004  |
| KR | 10-2005-0106916 | 11/2005 |
| KR | 10-2006-0106866 | 10/2006 |

* cited by examiner

*Primary Examiner*—Laura M Menz
(74) *Attorney, Agent, or Firm*—Blakely, Sokoloff, Taylor & Zafman LLP

(57) ABSTRACT

A method for fabricating a semiconductor device includes providing a substrate formed with a plurality of gate lines, each gate line including a hard mask, forming an etch barrier layer over the gate lines, forming an inter-layer insulation layer to cover the etch barrier layer, etching the inter-layer insulation layer to expose a portion of the etch barrier layer formed between the gate lines, forming an amorphous carbon layer over the exposed portion of the etch barrier layer and the remaining inter-layer insulation layer, and etching the amorphous carbon layer and the etch barrier layer to expose the substrate.

13 Claims, 4 Drawing Sheets

US 7,563,702 B2

METHOD FOR FABRICATING SEMICONDUCTOR DEVICE

BACKGROUND

The present invention relates to a method for fabricating a semiconductor device, and more particularly, to a method for fabricating a semiconductor device including a landing plug functioning as a contact plug.

As the integration scale of a semiconductor device has been increased, a sufficient process margin needs to be secured during a bit line or storage node contact process of a capacitor. Accordingly, a landing plug which is a kind of a contact plug is formed by performing a chemical mechanical polishing (CMP) process.

FIGS. 1A to 1D are cross-sectional views illustrating a typical method for fabricating a semiconductor device including a landing plug.

As shown in FIG. 1A, a plurality of gate lines 15 are formed over a substrate 10. Each gate line 15 is formed in a stack structure including a gate oxide layer 11, a polysilicon layer 12, a tungsten silicide layer 13, and a nitride-based layer 14 for use as a hard mask. An oxide layer 16 and a nitride layer 17 are sequentially formed over the substrate structure including the gate lines 15. The nitride layer 17 functions as an etch barrier layer for self-aligned contact (SAC) when forming a contact hole wherein a landing plug is to be formed. Then, an inter-layer insulation layer 18 is formed over the substrate structure.

Referring to FIG. 1B, a portion of the inter-layer insulation layer 18 is etched using the nitride layer 17 formed between the gate lines 15 as an etch barrier layer. The remaining inter-layer insulation layer 18 is denoted with reference numeral 18A. Thus, a contact hole 19 exposing a portion of the nitride layer 17 is formed. Referring to FIG. 1C, a buffer oxide layer 20 is formed over the substrate structure and in the contact hole 19 to compensate an insufficient lateral thickness of the nitride-based layers 14.

Referring to FIG. 1D, a cleaning process is performed to remove a given portion of the buffer oxide layer 20 existing over the substrate 10 between the gate lines 15. The remaining buffer oxide layer 20 is denoted with reference numeral 20A. Afterwards, an etch-back process is performed to etch the nitride layer 17 and the oxide layer 16 exposed in the contact hole 19. The remaining nitride layer 17 and the remaining oxide layer 16 after performing the etch-back process are denoted with reference numerals 17A and 16A, respectively. As a result, an opening 'O' exposing the substrate 10 between the gate lines 15 is formed.

However, the aforementioned etch-back process is performed with etch selectivity of approximately 1:1 between the oxide layers, i.e., the oxide layer 16 and the buffer oxide layer 20, and the nitride layers, i.e., the nitride layer 17 and the nitride-based layers 14. Accordingly, loss 'L' may be produced over the nitride-based layers 14 for use as a hard mask simultaneously to the formation of the opening 'O' exposing the substrate 10, thereby generating short-circuit or leakage current. Thus, device characteristics may deteriorate. The further etched remaining inter-layer insulation layer 18A is denoted with reference numeral 18B.

A thickness of the nitride-based layers 14 for use as a hard mask itself needs to be increased to remove the loss 'L'. However, if the thickness of the nitride-based layers 14 increases, an aspect ratio also increases. Thus, a gap-filling margin may be insufficient while forming the inter-layer insulation layer after the formation of the gate lines 15. As a result, a void may be produced in the inter-layer insulation layer between the gate lines 15.

SUMMARY OF THE INVENTION

The present invention provides a method for fabricating a semiconductor device, wherein the method can reduce loss that can be produced over a hard mask forming a gate line while forming a landing plug of the semiconductor device. Also, the method can prevent a void that can be generated in an inter-layer insulation layer formed to insulate gate lines during formation.

In accordance with one aspect of the present invention, there is provided a method for fabricating a semiconductor device, including: providing a substrate formed with a plurality of gate lines, each gate line including a hard mask; forming an etch barrier layer over the gate lines; forming an inter-layer insulation layer to cover the etch barrier layer; etching the inter-layer insulation layer to expose a portion of the etch barrier layer formed between the gate lines; forming an amorphous carbon layer over the exposed portion of the etch barrier layer and the remaining inter-layer insulation layer; and etching the amorphous carbon layer and the etch barrier layer to expose the substrate.

DETAILED DESCRIPTION OF THE EMBODIMENTS

FIGS. 2A to 2D are cross-sectional views illustrating a method for fabricating a semiconductor device including a landing plug in accordance with an embodiment of the present invention.

Figure 1A:
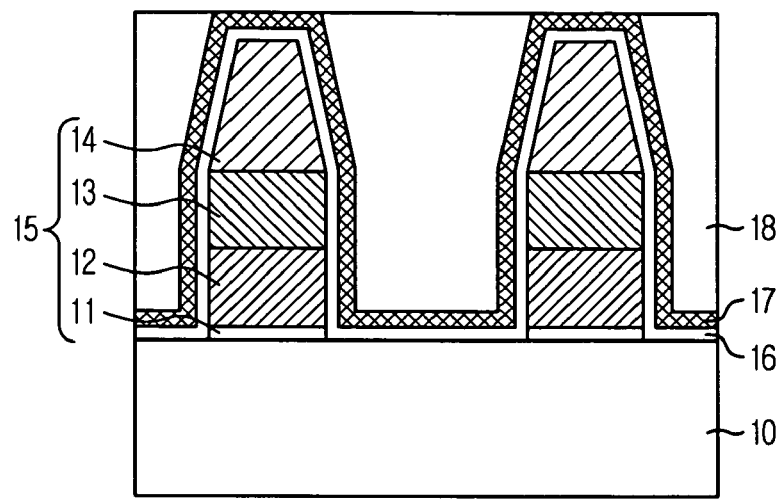
FIGS. 1A to 1D are cross-sectional views illustrating a typical method for fabricating a semiconductor device.
Figure 1B:
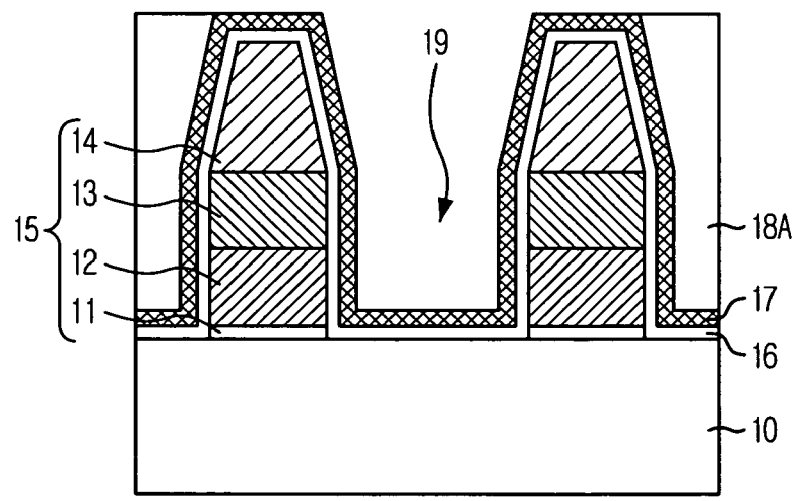
Figure 1C:
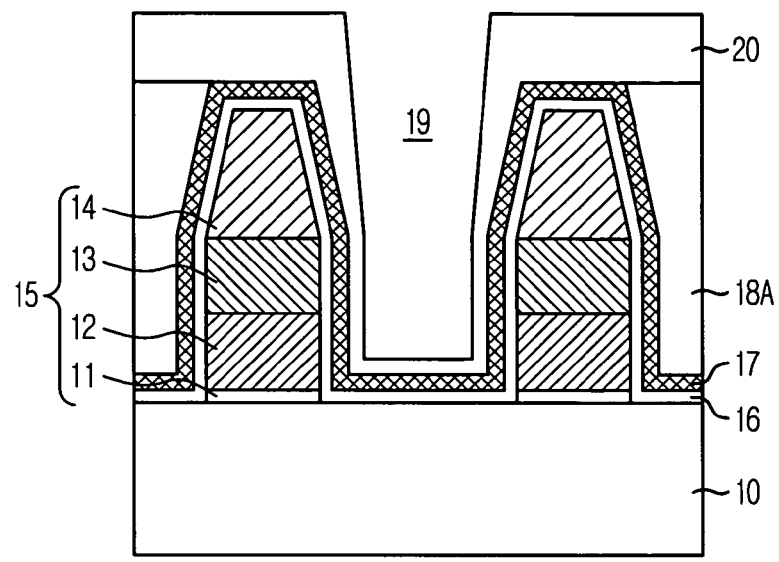
Figure 1D:
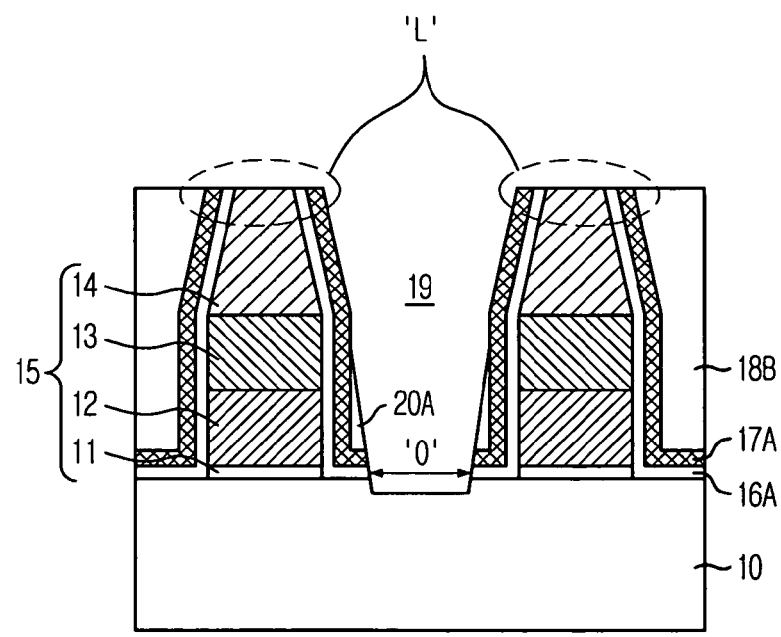
Figure 2A:
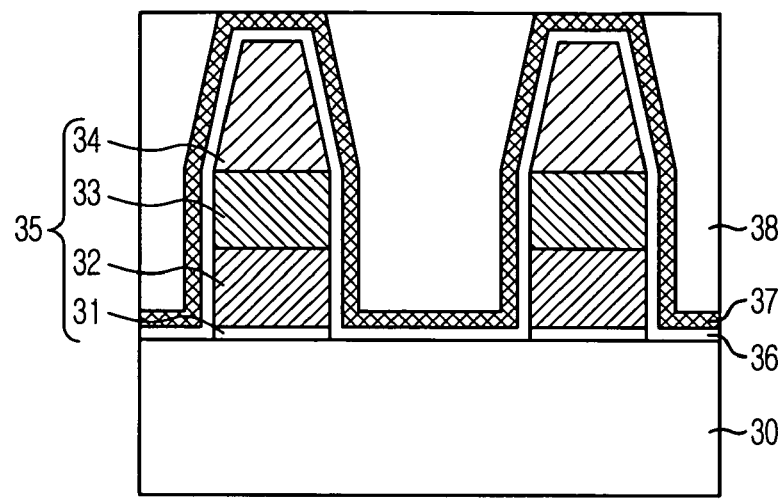
FIGS. 2A to 2D are cross-sectional views illustrating a method for fabricating a semiconductor device in accordance with an embodiment of the present invention.

As shown in FIG. 2A, a plurality of gate lines 35 are formed over a substrate 30. Each gate line 35 is formed in a stack structure including a gate oxide layer 31, a polysilicon layer 32, a tungsten silicide layer 33, and a nitride-based layer 34 for use as a hard mask. A stack structure including a tungsten layer and a tungsten silicide layer may be used instead of the single-layered tungsten silicide layer 33. An oxide layer 36 functioning as a buffer layer is formed the substrate structure including the gate lines 35. A nitride layer 37 functioning as an etch barrier layer for self-aligned contact (SAC) is formed over the oxide layer 36. An inter-layer insulation layer 38 is formed over the substrate structure.

Figure 2B:
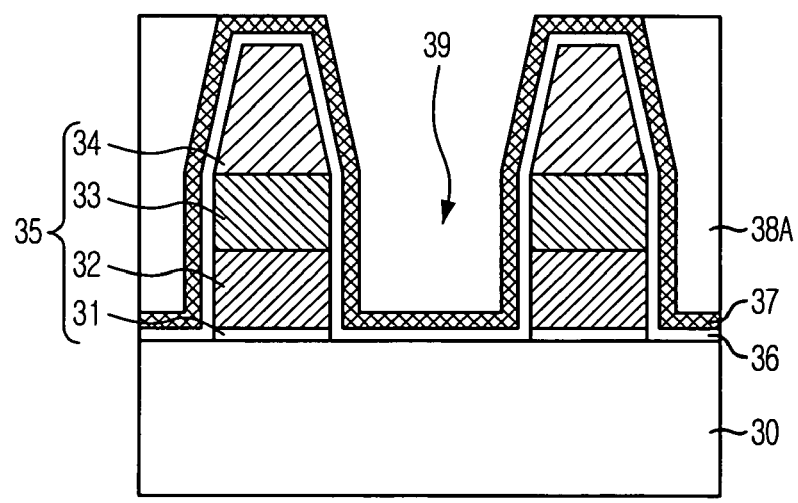

Referring to FIG. 2B, an etching process is performed to etch a portion of the inter-layer insulation layer 38 using a mask for forming a contact hole in which a landing plug is to be formed. The etching process selectively etches the inter-layer insulation layer 38 using the nitride layer 37 formed between the gate lines 35 as an etch barrier layer. The remaining inter-layer insulation layer 38 is denoted with reference numeral 38A. Consequently, a contact hole 39 exposing the nitride layer 37 is formed.

Figure 2C:
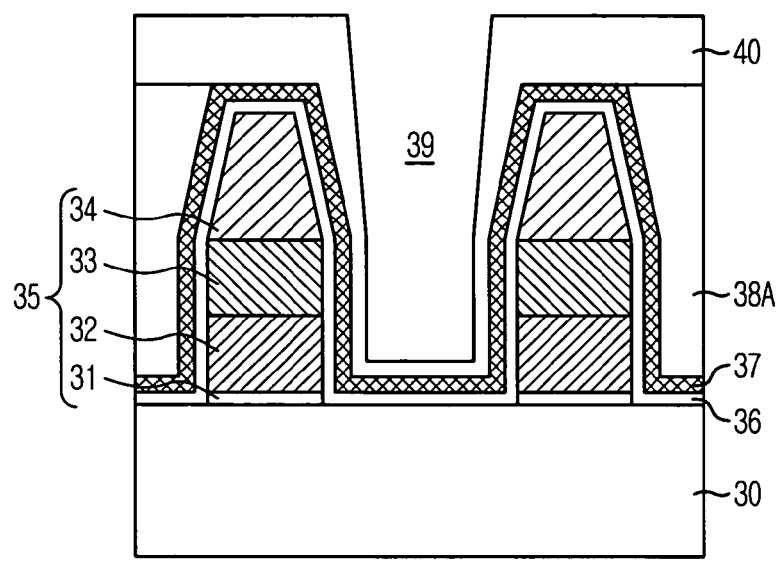

Referring to FIG. 2C, an amorphous carbon layer 40 is formed with an unequal thickness over the substrate structure and in the contact hole 39 to compensate an insufficient lateral thickness of the nitride-based layers 34. The amorphous carbon layer 40 is formed with a smaller thickness over the upper portion of the substrate 30 between the gate lines 35 and inner sidewalls of the contact hole 39 than upper portions of the gate lines 35. For instance, an overall thickness of the amorphous carbon layer 40 ranges from approximately 500 Å to approximately 1,000 Å. However, the amorphous carbon layer 40 is formed with a thickness of approximately 100 Å or less, e.g., the thickness ranging from approximately 10 Å to approximately 100 Å, over the upper portion of the substrate 30 between the gate lines 35 and sidewalls of the gate lines 35, that is, the inner sidewalls of the contact hole 39. The amorphous carbon layer 40 is formed over the upper portions of the gate lines 35 with a thickness of approximately 300 Å or greater.

Although the amorphous carbon layer 40 is exemplified in this embodiment of the present invention, other layers having a similar property to the amorphous carbon layer 40 can be used. Since the amorphous carbon layer 40 does not have a gap-filling property but an overhang property, that is, since the amorphous carbon layer 40 is formed to a larger thickness over the upper portions of the gate lines 35 than inside the contact hole 39, the amorphous carbon layer 40 can be naturally formed with a greater thickness over the upper portions of the gate lines 35 than over the substrate 30 between the gate lines 35 and over the sidewalls of the gate lines 35.

Figure 2D:
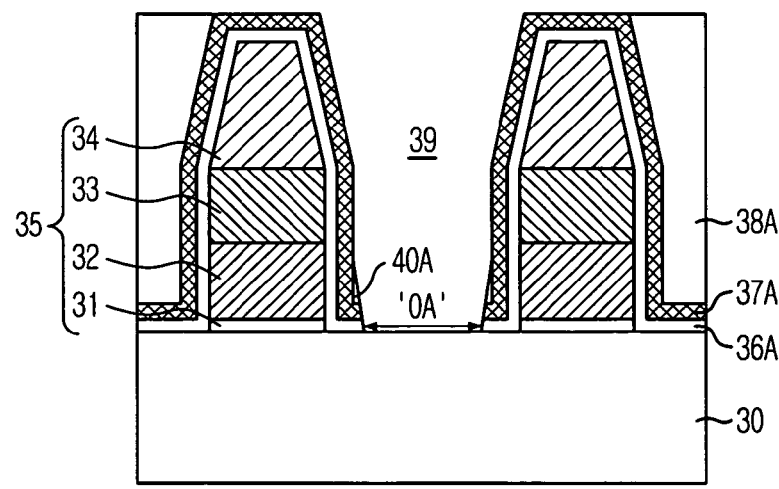

Referring to FIG. 2D, an etch-back process is performed to form an opening 'OA' exposing the substrate 30 between the gate lines 35. Particularly, the etch-back process may be performed using a dry etch method, and using etch selectivity of the amorphous carbon layer 40 to the nitride layer 37 to the oxide layer 36 maintained in a ratio of approximately 1:2:2 or greater. The etch selectivity of the oxide layer 36 and the nitride layer 37 is maintained approximately two times greater than that of the amorphous carbon layer 40. Accordingly, the etch-back process allows a given thickness of the amorphous carbon layer 40 to remain over the upper portions of the gate lines 35, and selectively removes the amorphous carbon layer 40, the nitride layer 37, and the oxide layer 36 existing over the substrate 30 in the contact hole 39. The remaining amorphous carbon layer 40 is denoted with reference numeral 40A. Although the remaining amorphous carbon layer 40A existing over the upper portions of the gate lines 35 is not illustrated, the remaining amorphous carbon layer 40A may substantially remain over the upper portions of the gate lines 35. The remaining nitride layer 37 and the remaining oxide layer 36 are denoted with reference numerals 37A and 36A, respectively.

According to this embodiment of the present invention, the remaining amorphous carbon layer 40A over the upper portions of the gate lines 35 with the given thickness serves a role of an etch barrier layer during the etch-back process. As a result, loss that can be caused on the nitride-based layers 34 for use as a hard mask during the etch-back process can be reduced. Also, a SAC failure can be reduced, and thus, reliability of the device can be improved. A thickness of the nitride-based layers 34 itself does not have to be increased when compared to the typical method, and accordingly, a void may not be produced in the inter-layer insulation layer formed after the formation of the gate lines 35.

A detailed recipe of the etch-back process is as follows. A polymer generating gas selected from a group consisting of nitrogen ($N_2$), diazene ($H_2N_2$), hydrogen ($H_2$), methane ($CH_4$), and a combination thereof can be used to selectively etch the amorphous carbon layer 40 existing over the upper portion of the substrate 30 between the gate lines 35. Although not shown, polymers produced while etching the amorphous carbon layer 40 existing over the substrate 30 between the gate lines 35 can be piled over the upper portions of the gate lines 35, i.e., over the remaining amorphous carbon layer 40A.

The nitride layer 37 and the oxide layer 36 exposed by the selective etch of the amorphous carbon layer 40 are etched and removed using a fluorine-based gas, e.g., tetrafluoromethane ($CF_4$) or trifluoromethane ($CHF_3$). Accordingly, the opening 'OA' exposing the substrate 30 between the gate lines 35 is formed, and the remaining amorphous carbon layer 40A stays over the upper portions of the gate lines 35 with the given thickness. Also, the remaining nitride layer 37A and the remaining oxide layer 36A stay covering the gate lines 35.

The remaining amorphous carbon layer 40A and the polymers staying over the upper portions of the gate lines 35 have high etch selectivity with respect to the remaining oxide layer 36A and the remaining nitride layer 37A during the etching of the nitride layer 37 and the oxide layer 36 existing between the gate lines 35. Accordingly, the remaining amorphous carbon layer 40A and the polymers can protect the nitride-based layers 34.

After the opening 'OA' exposing the substrate 30 between the gate lines 35 is formed, it is possible to sufficiently compensate the insufficient lateral thickness margin of the nitride-based layers 34. Although not shown, a removal process is performed to remove the remaining amorphous carbon layer 40A and the polymers.

According to this embodiment of the present invention, the contact hole exposing the nitride layer functioning as an etch barrier layer for SAC is formed, and then, the amorphous carbon layer having high etch selectivity with respect to the nitride layer and the oxide layer is formed over the substrate structure. The etch-back process is performed after forming the amorphous carbon layer such that the amorphous carbon layer formed over the gate lines protects the nitride-based layers for use as a hard mask configuring the upper portions of the gate lines. As a result, loss that may be caused on the nitride-based layers can be reduced. Also, a SAC failure of the landing plug can be reduced, thereby securing reliability of the device. Since a thickness of the nitride-based layers for use as a hard mask formed at the uppermost layer of the gate lines does not have to be increased when compared to the typical method, a void and a seam that can be produced in the inter-layer insulation layer formed after the formation of the gate lines can be prevented.

The present application contains subject matter related to the Korean patent applications Nos. KR 2006-0038785 and KR 2006-0121745, filed in the Korean Patent Office on Apr. 28, 2006 and Dec. 4, 2006, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    providing a substrate formed with a plurality of gate lines, each gate line including a hard mask;
    forming an etch barrier layer over the gate lines;
    forming an inter-layer insulation layer to cover the etch barrier layer;
    etching the inter-layer insulation layer to expose a portion of the etch barrier layer formed between the gate lines;
    forming an amorphous carbon layer over the exposed portion of the etch barrier layer and the remaining inter-layer insulation layer; and etching the amorphous carbon layer and the etch barrier layer to expose the substrate.

2. The method of claim 1, wherein the amorphous carbon layer is formed over upper portions of the gate lines with a greater thickness than over the substrate between the gate lines and sidewalls of the gate lines.

3. The method of claim 2, wherein the amorphous carbon layer is formed with a thickness ranging from approximately 10 Å to approximately 100 Å over the substrate between the gate lines and the sidewalls of the gate lines, and with a thickness of at least approximately 300 Å over the upper portions of the gate lines.

4. The method of claim 1, wherein etching the amorphous carbon layer and the etch barrier layer to expose the substrate comprises performing an etch-back process having etch selectivity of the etch barrier layer approximately at least two times greater than that of the amorphous carbon layer.

5. The method of claim 1, further comprising, prior to forming the etch barrier layer, forming a buffer layer over the gate lines.

6. The method of claim 5, wherein the buffer layer comprises an oxide-based material.

7. The method of claim 5, wherein etching the amorphous carbon layer and the etch barrier layer to expose the substrate comprises performing an etch-back process having etch selectivity of the etch barrier layer and the buffer layer approximately at least two times greater than that of the amorphous carbon layer.

8. The method of claim 7, wherein the etch barrier layer comprises a nitride-based layer.

9. The method of claim 5, wherein etching the amorphous carbon layer and the etch barrier layer to expose the substrate comprises:
   etching the amorphous carbon layer; and
   etching the etch barrier layer and the buffer layer.

10. The method of claim 9, wherein etching the amorphous carbon layer comprises using a gas selected from a group consisting of nitrogen ($N_2$), diazene ($H_2N_2$), hydrogen ($H_2$), methane ($CH_4$), and a combination thereof.

11. The method of claim 9, wherein etching the amorphous carbon layer comprises piling polymers produced by the etching of the amorphous carbon layer over the upper portions of the gate lines.

12. The method of claim 9, wherein etching the etch barrier layer and the buffer layer comprises using a fluorine-based gas.

13. The method of claim 12, wherein the fluorine-based gas comprises one of tetrafluoromethane ($CF_4$) and trifluoromethane ($CHF_3$).

* * * * *